(12) United States Patent
Serackis et al.

(10) Patent No.: US 11,520,947 B1
(45) Date of Patent: Dec. 6, 2022

(54) SYSTEM AND METHOD FOR ADAPTING GRAPHICAL USER INTERFACES TO REAL-TIME USER METRICS

(71) Applicant: Vilnius Gediminas Technical University, Vilnius (LT)

(72) Inventors: Arturas Serackis, Vilnius (LT); Dalius Navakauskas, Vilnius (LT); Dalius Matuzevicius, Vilnius (LT); Tomyslav Sledevic, Vilnius (LT); Vytautas Abromavicius, Vilnius (LT)

(73) Assignee: Vilnius Gediminas Technical University, Vilnius (LT)

( * ) Notice: Subject to any disclaimer, the term of this patent is extended or adjusted under 35 U.S.C. 154(b) by 0 days.

(21) Appl. No.: 17/412,268

(22) Filed: Aug. 26, 2021

(51) Int. Cl.
*G06F 9/451* (2018.01)
*G06N 20/00* (2019.01)
(Continued)

(52) U.S. Cl.
CPC .............. *G06F 30/12* (2020.01); *G06F 9/451* (2018.02); *G06F 9/453* (2018.02); *G06N 20/00* (2019.01); *G02B 27/0093* (2013.01)

(58) Field of Classification Search
CPC .......... G06F 30/12; G06F 9/451; G06F 9/453; G06N 20/00; G02B 27/0093
See application file for complete search history.

(56) References Cited

U.S. PATENT DOCUMENTS 8,032,839 B2   10/2011  Mall
8,533,604 B1    9/2013  Parenti et al.
(Continued)

FOREIGN PATENT DOCUMENTS

WO   2017127325   7/2017

OTHER PUBLICATIONS

Velichkovsky, B. B., Khromov, N., Korotin, A., Burnaev, E., & Somov, A. (2019). Visual fixations duration as an indicator of skill level in esports. In IFIP Conference on Human-Computer Interaction (pp. 397-405). Springer, Cham.
(Continued)

*Primary Examiner* — Roberto Borja
(74) *Attorney, Agent, or Firm* — Shannon K. Stauffer (57) ABSTRACT

The invention concerns a software based system for computer-aided design (CAD) that includes user interface tailoring and methods for continuously evaluating the learning progress of the user and increase work productivity by searching for the patterns in the user input to predict the goal of user actions and propose next action to reach the goal in optimal way. Components of the presented invention relate to collection of the different user input including at least eye tracking and user focus and attention related features; analyzing continuously user's behavior to evaluate user learning progress and work productivity related to the computer-aided design tool; monitoring user interface components that are used by the user; searching for the patterns in user behavior; tailoring user interface controls to maximize a work productivity at the same time increasing user's qualification profile. The core of the invention comprises gaze tracking as an input component for better user activity and performance tracking, component for features extraction fusion of different types user input, continuously monitored users qualification profile and two classifiers making decision on user interface complexity level and a set of most relevant graphical user interface controls for the next user action.

7 Claims, 4 Drawing Sheets

(51) Int. Cl.
  *G02B 27/00* (2006.01)
  *G06F 30/12* (2020.01)

(56) References Cited

U.S. PATENT DOCUMENTS

| | | | |
|---|---|---|---|
| 8,538,947 | B2 | 9/2013 | Matejka et al. |
| 8,584,026 | B2 | 11/2013 | Lynk et al. |
| 8,775,332 | B1 | 7/2014 | Morris et al. |
| 9,152,529 | B2 | 10/2015 | George |
| 9,729,403 | B1 | 8/2017 | Rabe et al. |
| 10,198,258 | B2 | 2/2019 | Edmonds et al. |
| 10,452,410 | B2 | 10/2019 | Arar et al. |
| 2011/0154216 | A1* | 6/2011 | Aritsuka ............ G06F 9/44505 715/745 |
| 2013/0152002 | A1 | 6/2013 | Menczel et al. |
| 2017/0322679 | A1* | 11/2017 | Gordon ................. G06N 20/00 |
| 2019/0171283 | A1* | 6/2019 | Dey ........................ G06F 3/013 |
| 2020/0133819 | A1* | 4/2020 | Grossman .......... G09B 19/0053 |

OTHER PUBLICATIONS

Pfeuffer, K., Abdrabou, Y., Esteves, A., Rivu, R., Abdelrahman, Y., Meitner, S., . . . & Alt, F. (2021). ARtention: A design space for gaze-adaptive user interfaces in augmented reality. Computers & Graphics, 95, 1-12.

Yigitbas, E., Josifovska, K., Jovanovikj, I., Kalinci, F., Anjorin, A., & Engels, G. (2019). Component-based development of adaptive user interfaces. In Proceedings of the ACM SIGCHI Symposium on Engineering Interactive Computing Systems (pp. 1-7).

Kolekar, S. V., Pai, R. M., & MM, M. P. (2019). Rule based adaptive user interface for adaptive E-learning system. Education and Information Technologies, 24(1), 613-641.

Diego-Mas, J. A., Garzon-Leal, D., Poveda-Bautista, R., & Alcaide-Marzal, J. (2019). User-interfaces layout optimization using eye-tracking, mouse movements and genetic algorithms. Applied ergonomics, 78, 197-209.

Maier, M., Elsner, D., Marouane, C., Zehnle, M., & Fuchs, C. (2019). DeepFlow: Detecting Optimal User Experience From Physiological Data Using Deep Neural Networks. In AAMAS (pp. 2108-2110).

Perez-Ramirez, M., Arroyo-Figueroa, G., & Ayala, A. (2019). The use of a virtual reality training system to improve technical skill in the maintenance of live-line power distribution networks.

Attig, C., Then, E., & Krems, J. F. (2019). Show Me How You Click, and I'll Tell You What You Can: Predicting User Competence and Performance by Mouse Interaction Parameters. In International Conference on Intelligent Human Systems Integration (pp. 801-806). Springer, Cham.

Firmenich, S., Garrido, A., Paternò, F., & Rossi, G. (2019). User interface adaptation for accessibility. In Web Accessibility (pp. 547-568). Springer, London.

Rathnayake, N., Meedeniya, D., Perera, I., & Welivita, A. (2019). A Framework for adaptive user interface generation based on user behavioural patterns. In 2019 Moratuwa Engineering.

Dey, A., Chatburn, A., & Billinghurst, M. (2019). Exploration of an EEG-based cognitively adaptive training system in virtual reality. In 2019 IEEE conference on virtual reality and 3d user interfaces (vr) (pp. 220-226). IEEE.

Kuzmenko, R. V. (2019). Adaptive driver training with the use of simulator systems. Information Technologies and Learning Tools, 74(6), 84-95.

Garcia-Ceja, E., Riegler, M., Kvernberg, A. K., & Torresen, J. (2019). User-adaptive models for activity and emotion recognition using deep transfer learning and data augmentation. User Modeling and User-Adapted Interaction, 1-29.

Plass, J. L., Homer, B. D., Pawar, S., Brenner, C., & MacNamara, A. P. (2019). The effect of adaptive difficulty adjustment on the effectiveness of a game to develop executive function skills for learners of different ages. Cognitive Development, 49, 56-67.

Mariani, A., Pellegrini, E., & De Momi, E. (2020). Skill-oriented and Performance-driven Adaptive Curricula for Training in Robot-Assisted Surgery using Simulators: a Feasibility Study. IEEE Transactions on Biomedical Engineering.

Lacoche, J., Duval, T., Arnaldi, B., Maisel, E., & Royan, J. (2019). Machine learning based interaction technique selection for 3D user interfaces. In International Conference on Virtual Reality and Augmented Reality (pp. 33-51). Springer, Cham.

Yigitbas, E. (2020). Model-driven engineering and usability evaluation of self-adaptive user interfaces. ACM SIGWEB Newsletter, (Autumn), 1-4.

Mezhoudi, N., & Vanderdonckt, J. (2021). Toward a Task-driven Intelligent GUI Adaptation by Mixed-initiative. International Journal of Human-Computer Interaction, 37(5), 445-458.

Medjden, S., Ahmed, N., & Lataifeh, M. (2020). Adaptive user interface design and analysis using emotion recognition through facial expressions and body posture from an RGB-D sensor. PloS one, 15(7), e0235908.

Medjden, S., Ahmed, N., & Lataifeh, M. (2020). Design and Analysis of an Automatic UI Adaptation Framework from Multimodal Emotion Recognition using an RGB-D Sensor. Procedia Computer Science, 170, 82-89.

\* cited by examiner

SYSTEM AND METHOD FOR ADAPTING GRAPHICAL USER INTERFACES TO REAL-TIME USER METRICS

FIELD OF INVENTION

The present invention relates to a method of adapting graphical user interface controls of computer-aided design software to maximize work productivity and increase a user's qualification profile. Adaptations are based on user input including monitoring of user focus and attention using gaze and pupil size tracking technologies; success of the user's interactions with the CAD software relative to his learning progress and work productivity; frequency of use of graphical user interface components; and patterns in user behavior.

BACKGROUND OF INVENTION

Modern computer-aided design (CAD) software tools are a collection of various algorithms and methods that are implemented as separate assets and are reached by the user using specific controls in the software's user interface. However, the more controls that are reachable by the user in the interface, the less intuitive this interface is. It is difficult to start using any CAD software without passing a significantly high learning curve. This results in situations where a user must acquire a high level of proficiency in working with the software's user interface by himself or with external training. The presented invention reverses this situation by introducing a system that adapts the CAD user interface to the user qualifications and selected tasks.

Current CAD software tools are do not include features for evaluation of the feedback from the user, the level of user skills in comparison to the user's historic record, and to other users using the same software tools and performing similar tasks. Current software tools give users access to all available functionality and to the majority of available options of each module, which impedes the success and learning of novice users by overwhelming them with options, many of which are far more complex than a novice user would know how to properly use.

To improve on existing CAD software user interfaces and tools, a system that adapts CAD software user interfaces to the user's needs and skill level is needed. The present invention solves the problem of the pre-training demand to start using CAD software tools. In addition, a system that adapts the software's user interface increases the motivation of the user to work with the software because it provides the user with faster achievement of his goal by proposing only the most important and frequently used controls related to pre-defined tasks and current progress towards the goal.

SUMMARY OF THE INVENTION

The present invention introduces a method for immersive, interactive learning for users at different experience levels by continuously monitoring a user's actions and behavior, tailoring the graphical user interface (GUI) based on user goal prediction and decisions about the group of GUI controls related to the current and possible next step of the user.

The present invention includes a method for adaptation of the graphical user interface and continuous evaluation of the learning progress and the work productivity of the user by searching for patterns in user input to predict the goal of user actions and by proposing next actions to reach the goal in an optimal way. The method can be configured into a computer program product that consists of seven main parts:

1. A graphical user interface of the computer-aided design software, which displays:
   a. at least one area for visualization of the modeled virtual environment;
   b. at least one area for placing a gallery of pre-built 3D models;
   c. at least one area for putting graphical user interface components and controls.
2. A software module performing a set of algorithms that collects user input data and/or signals from various sources and estimates quantitative features from each measurement at a desired frequency.
3. A software module performing a set of algorithms to select pre-built 3D models for a gallery, which can be included into the user's final model.
4. A software module performing a set of algorithms to calculate the user qualification profile and make a decision about user learning progress and level of skill according to a limited number of pre-defined user skill levels.
5. A software module performing a set of algorithms to search in the history of user behavior patterns and make a prediction of several user action steps that are most likely to follow next to accomplish the predicted short-term goal of the user.
6. A software module performing a set of algorithms to select a set of graphical user interface controls of varying complexity based on the user's skill level.
7. A database containing qualification profiles and user action patterns shared by multiple users.

The method is preferably run on a system comprising an output device, an input device, and a computer processor configured to execute the computer program product together with an instance of a computer-aided design software.

The method relies on input features, which may be received from input devices such as a gaze tracking device or camera or from user supplied input. Input features from user supplied responses and actions may be one or more of the following: personality class of the user, skill level in at least one software component, demographic data of the user, characteristics based on any user input mode (e.g., calculated by performing an analysis of mouse cursor motion, clicks; the number of different keyboard shortcuts used by the user, etc.), an action pattern of the user interacting with the user interface, or a variety and combination of other well known metrics that one skilled in the art can be assumed to know.

BRIEF DESCRIPTION OF THE DRAWINGS

Preferred embodiments of the present invention will be better understood from the following detailed drawings. One skilled in the art will recognize that the particular embodiments illustrated in the drawings are merely exemplary, and are not intended to limit the scope of the present invention.

DETAILED DESCRIPTION

The detailed description, which is presented below, provides preferred embodiments of the usage of the method to adapt a graphical user interface. The structure and sequences of actions are shown according to a preferred embodiment of usage, however other arrangements of the described features are possible while still being encompassed by the invention as claimed.

Figure 1:
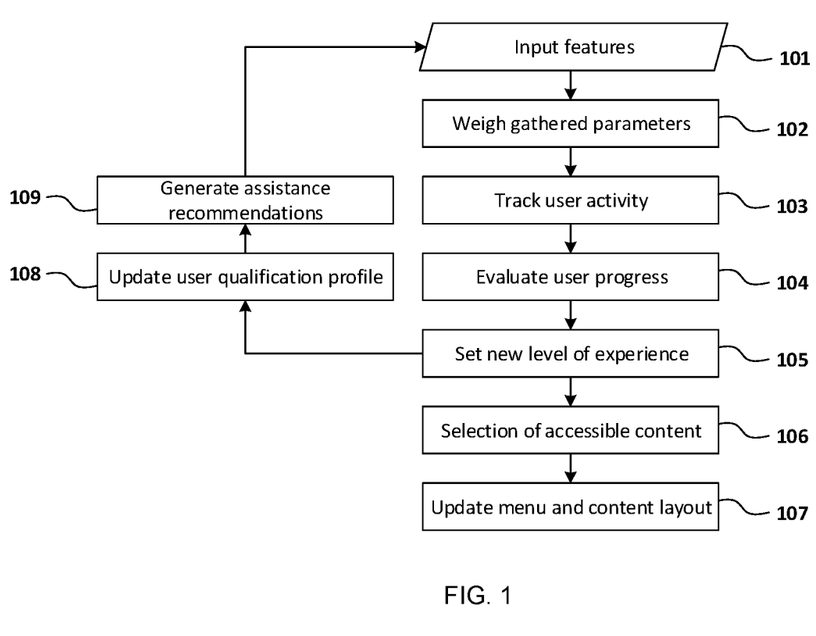
FIG. 1 is a general flow-chart depicting an example of the over-all method.

FIG. 1 is a general flow-chart depicting an example of the over-all method. Input features 101 include user profile data, skill level, historical data, and measurable characteristics captured by input devices. A system running this method may have various types of input devices, such as a mouse, touchscreen, keyboard, stylus, touchpad, trackball, accelerometer, microphone, gesture recognition, voice recognition, eye tracking, and/or any other input device. A separate, dedicated algorithm is used to estimate a single or several features from the use of each input device during a period of time, forming a time series of the features received from the input device. A minimum of three types of input devices should be used to extract features for this method: a keyboard, a mouse (or other device which imitates mouse behavior, such as stylus-based input or touch input), and an eye tracking device which tracks pupil size and gaze.

The gathered input features are weighed 102 according to collected statistics on the input devices and experience of the current user. User activity of every performed action (e.g., click of the button, selection of the algorithm from the drop-down menu, entering numerical value in the input field, dragging a pre-built 3D model from one place to another) and successful repetitions of each chain of performed actions are tracked 103 and registered continuously for every user registered on the present computer program product and running the same CAD software platform. A system configured to perform the present method may store the results of user performed action tracking in a local storage database or in an external database shared by other users working with a system that implements the same method.

Under the evaluation of user progress 104, the learning experience, indicated by the qualification profile of the user, is verified by applying a fuzzy logic based strategy. A new qualification level 105 is assigned to the user if his qualification profile and related inputs exceed a pre-defined threshold. The complexity level of GUI controls is selected 106 based on the qualification level of the current user. The user is shown his updated user qualification profile 108 which includes at least the qualification level. Additionally, the user qualification profile may contain an array of weighted input features, which can vary based on the collected data and the CAD environment being utilized.

Figure 2:
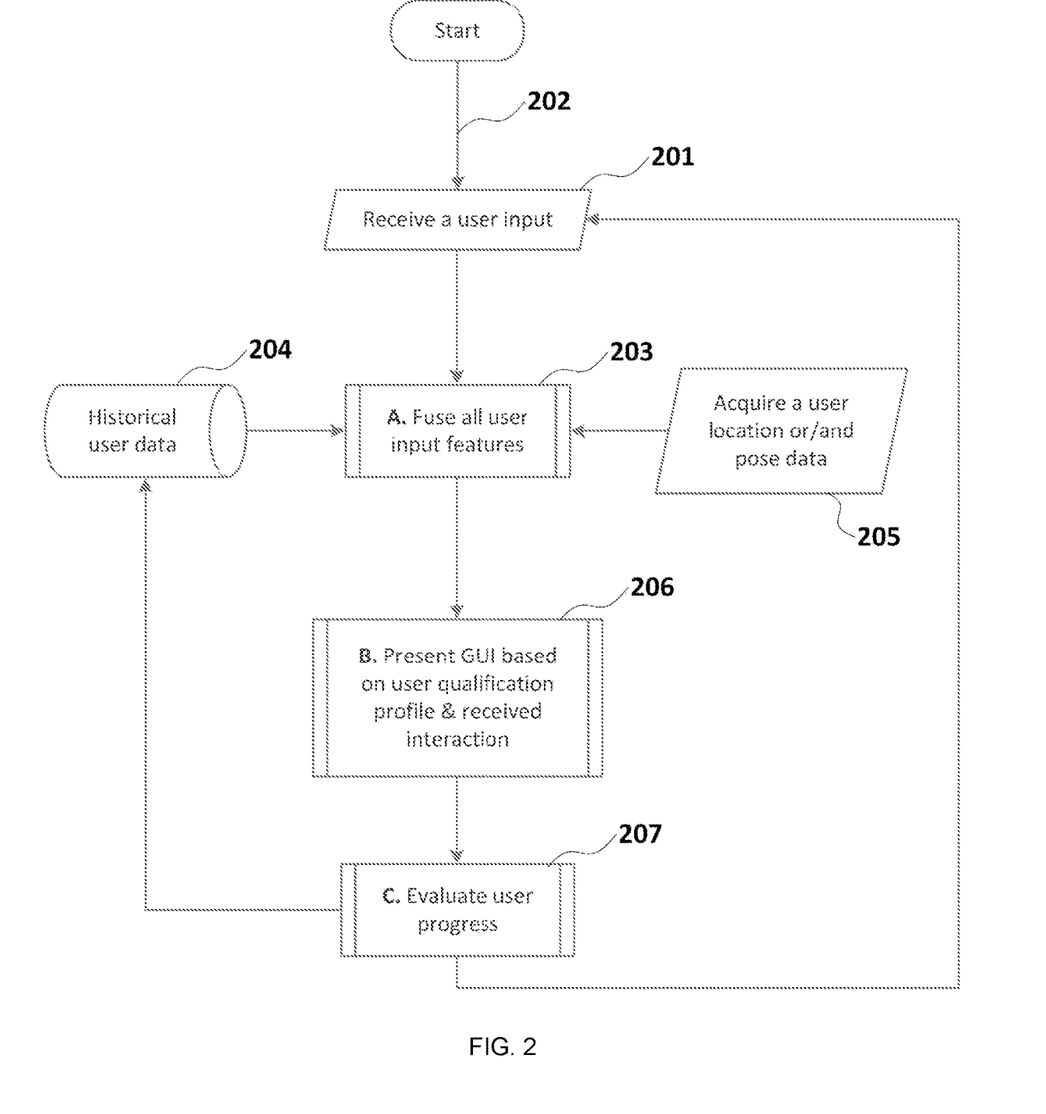
FIG. 2 is a schematic diagram describing an example of input data and/or signal collection and processing, which are required for continuous tracking of user activity and progress.
Figure 5:
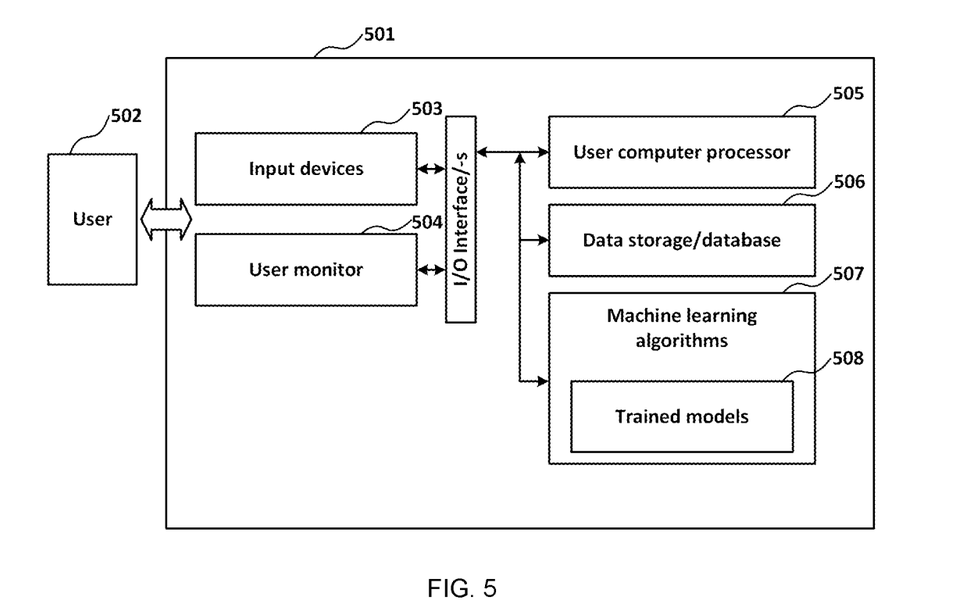
FIG. 5 is a schematic model of a preferred embodiment of system components.

As CAD software supports a wide variety of professional applications to accomplish are variety of modeling goals, embodiments of the present invention should compliment the instance of CAD software used and nature of work of each user. For instance, user experience is a variable in the user qualification profile including context information in the form of a category indicator—a numerical value pointing to a vocabulary of professions; the vocabulary of professions being a list of professions related to the nature of work and mapped with a unique numerical value. When gathering historical data 204 from the database 506, the user experience category indicators can be matched to all user qualification profiles to select only user qualification profiles containing the same user experience categories. In one example, the user is an expert in building stage constructions who has a high level of skill in putting the loudspeakers in the right place by taking into account the acoustic features of the concert hall. In this example, the user profile would include a user experience of stage construction and loudspeaker placement at a high level of the pre-determined scale, and his user qualification profile could be grouped with other user qualification profiles containing these user experiences at any level.

Figure 4:
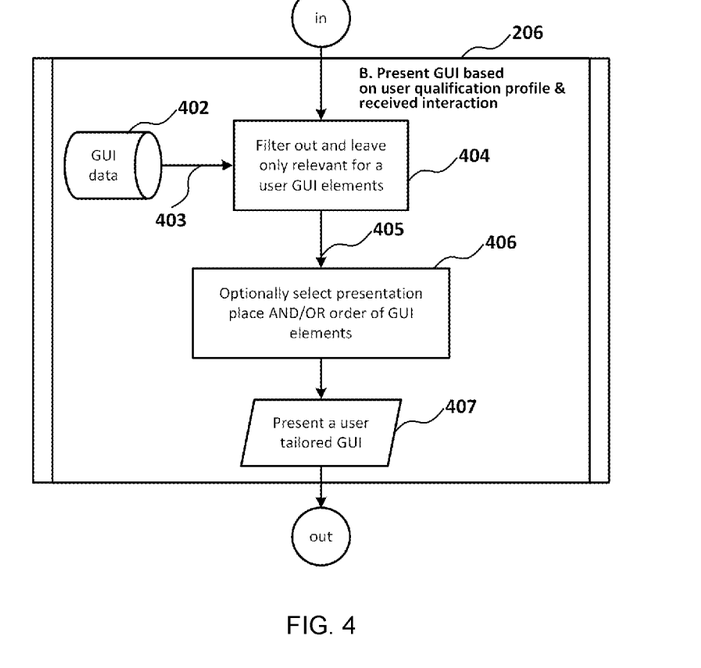
FIG. 4 is a schematic diagram of block 206, a method to adapt the graphical user interface.

The GUI controls may vary by the number of alternatives the user sees in the GUI, the way the user sets the numerical values for the algorithm accessed by GUI controls, or the balance between values set as default and values collected as user input. The system displays accessible GUI controls by updating the visible menu and content layout 107 determined by the method of block 206. The method generates assistance recommendations 109 that are relevant to the current user and may propose to try a new interaction type with the GUI or rarely used functionality implemented in the CAD system based on the proposed method.

In the context of the present invention, graphical user interface components are composed of a set of algorithms dedicated to implement discrete functionalities of the software shown in GUI as visualization windows, menus, user input modules, and recommendation windows. The controls are the elements of GUI dedicated to capture user input for calling a specific algorithm, enter commands manually, or select from the pre-defined lists the numerical values of algorithm parameters or switch between different algorithm modes.

Figure 3:
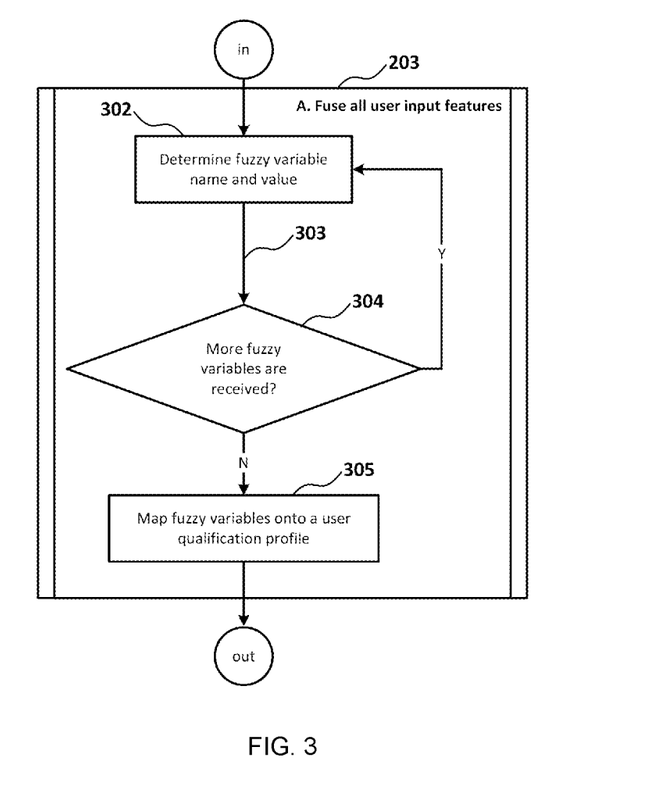
FIG. 3 is a schematic diagram of block 203, a method to fuse user input features.

FIG. 2 is a schematic diagram describing a preferred embodiment of input data and/or signal collection and processing, which is required for continuous tracking of user activity and progress. To form a collection of input features, block 201 collects user input, such as a set of data and/or signals that may have various froms or formats and may require pre-processing such as frame analysis of a time-series signal or producing heat map indicating gaze positions, and/or block 201 collects input, such as previously estimated or initial user qualification level value, which can be sent to the feature fusion block 203 directly. Acquisition of different input signal types requires dedicated interfaces and signal pre-processing units. Pre-processing of the input signals may include linear or non-linear signal filtering, estimation of statistical parameters, or estimation of input features from the frame analysis of input signals using other specific mathematical models, which are well-known in the art. User progress indicators, specifically user qualification profiles, are stored in the system database and are accessed using a dedicated interface. All collected input features are transmitted to the input features fusion block 203 using any compatible interface. Input features 101 are fused with historical user data 204 and transmitted to the fusion module 203 using any compatible data interface. User location and/or pose estimation data 205 are also received. Here, the 2D coordinates are transferred to the fusion block 203 using any compatible data transfer interface. If pose data is estimated in block 205, a set of 2D coordinates that correspond to the joints of the human body are saved as a matrix and transmitted to the fusion block 203. The fusion block 203 sends weighted features using any compatible interface. In block 203, one or more of any well-known machine learning algorithm may be implemented and can be selected dynamically. For example, said block may be based on Fuzzy logic algorithms (FIG. 3). Block 203 (machine learning based algorithm or a combination of algorithms) is used to set the weights of each input feature and to infer attributes (components) of the user qualification profile.

A critical set of features that increases the robustness of user qualification level estimation and setting the correct qualification profile are based on time series data obtained from a gaze tracking device. By measuring the relative amount of time a user is focusing on a particular GUI control or the number of controls the user is analyzing visually over a short period of time, the method can infer how focused the user is currently on a task, how long and with what frequency the user takes breaks, and when the user is confused by the current GUI controls. Another important aspect is the ability to monitor the pupil size changes over a period of time. The pupil size changes over time are used as a feature to indicate fatigue and are used in the input feature fusion block (see FIG. 3). It compensates for the uncertainties of gaze tracking based on user concentration level estimation by providing an additional membership function in 305 that maps the threshold of user concentration level with the level of fatigue and user qualification level. In one embodiment, the gaze tracking of a set of GUI controls presented to the user is used as a feature indicating which types of controls or 3D model library elements the user is analyzing visually. This becomes a powerful feature for indication of user profession and experience in the user qualification profile.

Block 206 constructs a GUI based on user qualification profile. The GUI consists of menus and user controls that are divided into several groups and clustered according to the complexity level and type of action it carries out. The type of action predicted is based on the last action performed by the user. The complexity is selected according to the user qualification level. The selection is performed by applying separate machine learning models: one trained to classify between complexity levels; another to classify between control types. Block 206 also monitors the user's next interaction with the GUI and sends the executed commands to block 207, where an algorithm for user progress evaluation is activated. This algorithm updates user qualification profile and sends it to block 204 and 201.

FIG. 3 is a schematic diagram of block 203 method to fuse user input features. Each input feature passes through a fuzzy rule based system. First a fuzzy variable name and value is determined in block 302 and added to an input vector. The system checks if there are more fuzzy variables available in the current system setup (block 304). If all fuzzy variables are processed, mapping of these variables to user qualification profile is performed in block 305.

FIG. 4 is a schematic diagram of the sub-block 206 method to tailor the graphical user interface. The main purpose of this block is to select the most relevant CAD software menu and GUI controls that the user might need for the predicted next step based on the the user's activity history, if available, and to show a subset of controls which corresponds to the users current qualification level. The GUI data in 402 includes all available GUI controls for a particular GUI software. At block 404, only the relevant GUI controls, according to the type and complexity level of the user are selected, and the remaining GUI controls are filtered out. GUI control order and position are reorganized in block 404 or are left unchanged if the ordering option is disabled in CAD software settings. Finally a tailored GUI is presented to the user in 407.

FIG. 5 is a schematic model of a preferred embodiment of system components. The use's computer processor runs an instance of CAD software and the adaptive interface software of the present invention. The user's monitor shows the adapted user interface of the CAD software. The computer processor is configured with local non-transient memory storage hardware or is connected to an independent non-transient memory storage. The user interface and display are connected to the computer processor 505 by I/O interconnects. The computer processor contains or is connected to a data storage device 506 and is configured to run the machine learning algorithms 507 as well as store the trained machine learning models 508.

In the preferred embodiments, input device 503 has a number of hardware components well known to those skilled in the art, which can receive input from a user, for example, a mouse, keyboard, stylus, optical pen, touch screen, touchpad, microphone, camera, depth camera, or other similar devices. Any suitable mode can provide the input, for example, one or more of: pointing, tapping, pressing, typing, dragging, gazing, speech, gesture and/or any other visual cue.

The input features that are used in block 203 (FIG. 2) may include any recognized characteristics of a user. There can be any number of input features including, for example, personality class of the user expressed as a number, position, class, label, or other mode. Classification of the user's personality class may be applied using computing methods, standard Emotional Intelligence (EQ) tests, Myers-Briggs, or any other testing method aimed at construction of a coherent picture of dominant psychological processes of the user.

Additionally, or alternatively, such input features may also include user's qualification level, the qualification level being a default or estimate from the previous iteration of the algorithm. The qualification level of a user can be expressed as a number of a predetermined scale. In some embodiments, this scale may be represented in ascending order, in other in descending order.

Further, the user qualification profile may include information about user's competence using a single or combination of software components. These may include derivations from interaction with the user interface, clicking patterns with input device, use of hotkey combinations, preferred use of the input devic, when plurality of input devices is available, preferred menu layout, pattern of navigation through this layout, icons, or menus. Moreover, qualification profiles may include the awards and achievements issued to the user within the adapted GUI computer program product.

Additionally, the qualification profile may include history of user inputs and/or actions recorded in previous sessions. Moreover, the qualification profile may include the elapsed time for the user to choose or select desired functions, menu, icons, or any other aspect in the user interface. The qualification profile also may be derived from the user's choice to use prompted or available help tools to become familiar with the user interface. Additionally, a qualification profile may include comparative metrics from the database containing information about skill level of other users.

Additionally, or alternatively, such input features may include demographic data of the user. Demographic data may include information such as sex, income, education level, work experience, location, age, ethnicity, preferred social media platforms, hobbies, and/or other demographics of the user. Such characteristics mentioned above may be collected directly from the user using queries, registration forms, or indirectly using any other available method. Some of these characteristics mentioned above may not be collected due to user consent forms, regulations, or ethical values.

Additionally, or alternatively, such input features may include but are not limited to features based on any user input mode, such as heat maps of one or many input modes, for example, gaze heat map, mouse activity map, most common keyboard combinations, typing speed, typing accuracy, pupil size, time between inputs, length of the session. Additionally, the mode of input is recorded as characteristic for input feature.

Additionally, or alternatively, such input features may include action models of the user actions corresponding to the user interface. Such action models may be derived from series of user inputs from one or many input devices. Such models may include, for example, a pattern of user completing desired task, the time between user clicks of a mouse, heat maps of the mouse location. Additionally, action models may be derived using a forecast of the goal. This forecast may be derived using other input features described above, or alternatively, the initial choices using the graphical user interface.

Additionally, or alternatively, such input features may be obtained using a gaze tracking device or method. Such input features may be derived using data from an eye gaze tacking system, for example, this data may include pupil size, spatial location of iris center, or gaze point. Input features which may be derived using gaze tracking device include, but are not limited to, saliency maps, change in pupil size over time, gaze direction, illuminance level, pupillary distance, head pose, blinking frequency, visual discomfort, attention areas, and user's fatigue level.

Gaze tracking may be based on image analysis algorithms applied to the video stream received from the camera, pointing at the user's face. Alternatively, gaze tracking might be performed using another dedicated device that is able to track gaze over a period of time and produce a heat map which is used as an input to the system. The heat map is used as an input to evaluate user reaction to the presented GUI controls. Confidence, user activity, and other features are derived from a corresponding heat map as a set of local peaks above a threshold, which can either be set manually or calculated adaptively. Local peaks can be identified by applying a filter for data that is below the pre-defined threshold, for instance, the mean or median value in the heatmap, and the identified local points can be used to provide more context to the 104, 105 blocks in FIG. 1. Additionally, this method for identifying local points, specifically when applied to gaze and pupil tracking heatmaps, can distinguish between periods of activity and inactivity; when the user is actively working with GUI and when the user is not.

A varying number of continuously collected input features from the user are fused (301) in a user qualification profile. This fusion step can be performed, for example, by the use of a fuzzy network comprising the following steps: initially determining an active input feature; assigning to it a correct fuzzy variable name and related membership functions; fusing the input feature value and receiving its fuzzy value; repeating previous steps until all input features are acquired; then mapping given fuzzy variables onto a user qualification profile. The user qualification profile is then used by the system to select the complexity of the GUI controls and can be used additionally to indicate the current learning progress of the user. A threshold for advancing to the next qualification level is determined by evaluating which is the next highest qualification level, the information about user qualification profile threshold (qualification level). Optionally, fused input features that fall under the user qualification profile are passed to block 206 for further post-processing.

The graphical user interface is generated according to the user qualification profile by a machine learning based GUI tailoring block (206). The graphical user interface may be displayed on a user's monitor, such as mobile phone, computer monitor, projector or any other device with display that is connected to a computer processor which has installed an instance of CAD software together with the computer program product of the present invention. The graphical user interface is generated and displayed with varying complexity for each user performing various tasks. The tailoring steps for the user interface are determined by a classification system, which includes one classifier for user's qualification level estimation and one classifier for selection of relevant GUI control types. The complexity of the user interface is predominantly affected according to the user's qualification level. In one embodiment, the graphical user interface (404 and 406 in FIG. 4) is adapted to a user in at least one area of visualization containing intermediate or final results of modeled virtual environment with different 3D models included. In another embodiment the graphical user interface may be adapted to a user in at least one area for placing the gallery of pre-built 3D models. Additionally or alternatively, the graphical user interface may be adapted to a user in at least one area for putting user interface components and controls.

In an exemplary embodiment, initially a graphical user interface, UI1, is generated as a low complexity user interface for simple CAD operations. This interface is simplest and may be presented to a user with a low or default qualification level, which is stored in the database. The displayed GUI components or/and controls are displayed using large images and font sizes. This user interface configuration may be aimed at introducing the user to the CAD software through placement of its components and controls suitable for workflow of a basic virtual model preparation. Additionally, the UI1 configuration is suitable for introducing the user to operating the components and controls. Such controls may be aimed at leading the user to understandable solutions and may be a more intuitive user interface. The number of displayed interface components is less than for higher complexity user interfaces. Complimentary parameters of selected components are set to default values and are not displayed for the user. However, such complementary parameters can be accessed and modified using various sub-menus or command line input. The number and type of the displayed components is determined by the algorithms being executed in 404 block (FIG. 4).

A more complex interface, UI2, may be generated, which provides additional features that may be desired by a moderately proficient user. UI2 may include a wider variety of controls and settings for the user, a higher number of instantly available controls compared to the UI1 setup. The number and type of the displayed components is determined by the algorithms being performed in 404 block (FIG. 4).

The highest complexity user interface, UI3, may contain numerous features that may be desired by a very proficient user (i.e. a 'power' user). As an example, the color value of the CAD object in UI1 is selected from 16 base colors, in UI2 the color value is selected interactively pointing on the colormap, and in UI3, the user additionally may be able to set manually the numerical values of Red Green and Blue components and change the color coding scheme. The number and type of the displayed components is determined by the algorithms being performed in 404 block (FIG. 4).

The invention claimed is:

1. A method for adapting a graphical user interface of computer-aided design software; the method comprising:

receiving input data and/or signals from one or more input devices from a user, wherein at least one of the input data and/or signals is real-time user gaze tracking and at least one of the input data and/or signals is real-time user pupil size tracking;

performing fusion of input data and/or signals;

estimate a user qualification profile, wherein the qualification profile is a multi-dimensional array object;

retrieving historical user qualification profiles from a database;

estimating a user qualification level, wherein the qualification level is a number within a finite range;

estimating complexity level of a GUI control, wherein the complexity level is a number within a finite range;

continuously receiving user input data and/or signals during user interaction with the graphical user interface of computer-aided design software, updating fused input data and/or signals, and mapping fused input data and/or signals to the user qualification profile;

predicting a goal of the user interaction and recommending next actions to complete the goal using input data and/or signals and historical user qualification profiles from the database;

selecting one or more pre-built 3D models from a database of models which relate to the predicted goal;

performing machine learning algorithms to determine an optimal graphical user interface from a finite set of user interface arrangements based on the fused input data and/or signals, a current user qualification profile, and historical user qualification profiles from the database; and displaying an optimal graphical user interface, selected pre-built 3D models, and recommendations to complete a predicted next action.

2. The method of claim 1, further comprising receiving input data and/or signals wherein the input data and/or signals are two or more of:
  user input activity, including clicking patterns with input device, use of hotkey combinations, preferred use of the input device when a plurality of input devices are available, preferred menu layout, pattern of navigation through the layout, icons, or menus;
  data based on any user input mode, including heat maps of one or many input modes, for example, gaze heat map, mouse activity map, most common keyboard combinations, typing speed, typing accuracy, pupil size, time between inputs, length of a session;
  user personality classification; and
  user demographics, including sex, income, education level, work experience, location, age, ethnicity, preferred social media platforms, or hobbies.

3. The method of claim 1, wherein performing fusion of input data and/or signals further comprises the steps:
  (a) determining active inputs from the input data and/or signals that are actively being measured;
  (b) assigning active inputs to a fuzzy variable name and related membership functions;
  (c) fusing active input by assigning weights and aggregating the active input and a corresponding active input fuzzy value;
  repeating steps (a), (b), (c) until all input data and/or signals are fused; and
  mapping fused fuzzy variables onto a user qualification profile.

4. The method of claim 1, wherein estimating a user qualification level further comprises defining a finite range and threshold levels, after which, the user qualification level is increased.

5. The method of claim 1, wherein performing machine learning algorithms to determine the optimal user interface uses at least two classifiers:
  (a) a software based classifier for selecting an appropriate graphical user interface complexity level based on the user qualification profile and qualification level; and
  (b) a software based classifier for selecting user interface controls most relevant to a user action.

6. A computer program product for adapting a graphical user interface of computer-aided design software, the computer program product being tangibly embodied on a non-transitory computer-readable medium and including executable code that, when executed, is configured to cause a data processing apparatus to:
  receive input data and/or signals from one or more input devices from a user, wherein at least one of the input data and/or signals is real-time user gaze tracking and at least one of the input data and/or signals is real-time user pupil size tracking;
  perform fusion of input data and/or signals;
  estimate a user qualification profile, wherein the qualification profile is a multi-dimensional array object;
  retrieve historical user qualification profiles from a database;
  estimate a user qualification level, wherein the qualification level is a scalar number within a finite range;
  continuously receive user input data and/or signals during user interaction with the graphical user interface of computer-aided design software, update the fused input data and/or signals, and update the user qualification profile;
  predict a goal of the user interaction and recommend next actions to complete the goal using input data and/or signals and historical user qualification profiles from the database;
  select one or more pre-built 3D models from a database of models which relate to the predicted goal;
  perform machine learning algorithms to determine an optimal graphical user interface from a finite set of user interface arrangements based on the fused input data and/or signals and the user qualification profile; and
  display the optimal graphical user interface, selected pre-built 3D models, and recommendations to complete a predicted next action.

7. A system comprising:
  an output display device, wherein the output display device is a user monitor;
  at least three input devices, wherein at least one device is one of gaze tracking device or camera, a keyboard, and at least one of a mouse, stylus, optical pen, touch screen, touchpad, or microphone; and
  a memory device connected to at least one processor; wherein
  the at least one processor is configured to:
  receive input data and/or signals from one or more input devices from a user, wherein at least one of the input data and/or signals is real-time user gaze tracking;
  perform fusion of input data and/or signals;
  estimate a user qualification profile, wherein the qualification profile is a multi-dimensional array object;
  retrieve historical user qualification profiles from a database;

estimate a user qualification level, wherein the qualification level is a scalar number within a finite range;

continuously receive user input data and/or signals during user interaction with the graphical user interface of computer-aided design software, update fused input data and/or signals, and update user qualification profile;

predict a goal of the user interaction and recommend next actions to complete the goal using input data and/or signals and historical user qualification profiles from the database;

select one or more pre-built 3D models from a database of models which relate to the predicted goal;

perform machine learning algorithms to determine an optimal graphical user interface from a finite set of user interface arrangements based on the fused input data and/or signals and user qualification profile; and display the optimal graphical user interface, selected pre-built 3D models, and recommendations to complete a predicted next action.

* * * * *